United States Patent
Wang et al.

(10) Patent No.: US 10,276,430 B2
(45) Date of Patent: Apr. 30, 2019

(54) SILICON-ON-INSULATOR DEVICE AND INTERMETALLIC DIELECTRIC LAYER STRUCTURE THEREOF AND MANUFACTURING METHOD

(71) Applicant: CSMC TECHNOLOGIES FAB1 CO., LTD., Wuxi New District (CN)

(72) Inventors: Zhiyong Wang, Wuxi New District (CN); Dejin Wang, Wuxi New District (CN); Jingjing Ma, Wuxi New District (CN)

(73) Assignee: CSMC TECHNOLOGIES FAB1 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 15/119,289

(22) PCT Filed: Apr. 29, 2015

(86) PCT No.: PCT/CN2015/077877
§ 371 (c)(1),
(2) Date: Aug. 16, 2016

(87) PCT Pub. No.: WO2015/165411
PCT Pub. Date: Nov. 5, 2015

(65) Prior Publication Data
US 2017/0011957 A1 Jan. 12, 2017

(30) Foreign Application Priority Data

Apr. 29, 2014 (CN) .......................... 2014 1 0178535

(51) Int. Cl.
*H01L 27/12* (2006.01)
*H01L 23/528* (2006.01)
*H01L 23/532* (2006.01)
*H01L 21/768* (2006.01)
*H01L 21/02* (2006.01)

(52) U.S. Cl.
CPC .. *H01L 21/76834* (2013.01); *H01L 21/02131* (2013.01); *H01L 21/02164* (2013.01);
(Continued)

(58) Field of Classification Search
None
See application file for complete search history.

(56) References Cited

U.S. PATENT DOCUMENTS

2009/0261396 A1* 10/2009 Gogoi .................. H01L 21/764
257/298
2009/0261421 A1* 10/2009 Gogoi ............. H01L 21/823412
257/378

(Continued)

FOREIGN PATENT DOCUMENTS

CN 101211800 A 7/2008
CN 102054839 A 5/2011

(Continued)

OTHER PUBLICATIONS

English Translation of International Search Report for International Application No. PCT/CN2015/077877, dated Jul. 9, 2015 (2 pages).

(Continued)

*Primary Examiner* — Telly D Green
(74) *Attorney, Agent, or Firm* — Kagan Binder, PLLC

(57) ABSTRACT

Provided is an intermetallic dielectric layer structure of a silicon-on-insulator device, comprising a silicon-rich oxide layer (54) covering a metal interconnect, a fluorine-silicon glass layer on the silicon-rich oxide layer, and a non-doped silicate glass layer on the fluorine-silicon glass layer; the thickness of the silicon-rich oxide layer (54) is 700 angstroms ±10%; the silicon-rich oxide layer having a greater thickness captures movable ions on an unsaturated bond, such that it is difficult for the movable ions to pass through the silicon-rich oxide layer, thus blocking the movable ions.

(Continued)

The present invention has good performance in an integrity evaluation of the gate oxide layer, and avoids damage to the device caused by the aggregation of movable ions at an interface. Also provided are a silicon-on-insulator device and a method of manufacturing the intermetallic dielectric layer of the silicon-on-insulator device.

4 Claims, 3 Drawing Sheets

(52) U.S. Cl.
CPC .. *H01L 21/02274* (2013.01); *H01L 21/76801* (2013.01); *H01L 23/5283* (2013.01); *H01L 23/53295* (2013.01); *H01L 27/1248* (2013.01); *H01L 2924/0002* (2013.01)

(56) References Cited

U.S. PATENT DOCUMENTS

| | | | | |
|---|---|---|---|---|
| 2009/0261446 | A1* | 10/2009 | Gogoi | H01L 21/76208 257/500 |
| 2011/0127158 | A1* | 6/2011 | Hamaya | C23C 14/564 204/192.25 |
| 2013/0161638 | A1* | 6/2013 | Yao | H01L 29/402 257/76 |
| 2013/0256800 | A1* | 10/2013 | Qiao | H01L 27/1203 257/350 |
| 2015/0206794 | A1* | 7/2015 | Chao | H01L 21/31051 438/666 |
| 2016/0233333 | A1* | 8/2016 | Toh | H01L 43/12 |
| 2017/0194490 | A1* | 7/2017 | Li | H01L 21/76897 |

FOREIGN PATENT DOCUMENTS

| | | | |
|---|---|---|---|
| CN | 102623491 | A | 8/2012 |
| CN | 102820256 | A * | 12/2012 |
| CN | 103633128 | A * | 3/2014 |

OTHER PUBLICATIONS

First Office Action (and English Translation thereof) and related Search Report for Chinese Application No. 201410178535.8, dated May 22, 2017 (17 pages).

* cited by examiner

SILICON-ON-INSULATOR DEVICE AND INTERMETALLIC DIELECTRIC LAYER STRUCTURE THEREOF AND MANUFACTURING METHOD

FIELD OF THE INVENTION

The present invention relates to semiconductor devices, and particularly relates to an intermetallic dielectric layer structure of a silicon-on-insulator device, a device having the intermetallic dielectric layer structure, and a method of manufacturing an intermetallic dielectric layer of the silicon-on-insulator device.

BACKGROUND OF THE INVENTION

In a conventional 0.18 micron logic 1.8V/3.3V silicon-on-insulator (SOI) process, a 0.18 micron logic process is usually used in the back end process. However, through experimental study, the inventor finds that a larger number of mobile ions are generated during the back end process. These mobile ions can conduct along the metal lead, the via, and the intermetallic film, and accumulate at the Si—$SiO_2$ interface, the polysilicon (Poly) edge and the like, which influences the interface state. For the ordinary bulk silicon process, these mobile ions can be discharged out of the substrate, such that the accumulative phenomenon is not obvious. However, for the SOI process, due to presence of buried layer oxidation, the mobile ions cannot be discharged. Therefore, the device can be influenced obviously, which may easily cause disadvantages of gate oxide (GOX), junction or Poly edge. In evaluation of gate oxide layer integrity (GOI), GOI fail occurs.

SUMMARY OF THE INVENTION

Accordingly, in order to address the problem of failing of the device in evaluation of gate oxide layer integrity, it is necessary to provide a new intermetallic dielectric layer structure of a silicon-on-insulator device.

An intermetallic dielectric layer structure of a silicon-on-insulator device includes a Si-rich oxide layer covering a metal interconnection, a fluorine-silicon glass layer formed on the Si-rich oxide layer, and an undoped silicate glass layer formed on the fluorine-silicon glass layer; wherein a thickness of the Si-rich oxide layer is 700 angstroms ±10%.

In one of embodiments, the Si-rich oxide layer is an in-situ Si-rich oxide layer.

In one of embodiments, a thickness of the undoped silicate glass layer is 2000 angstroms ±10%.

In one of embodiments, the intermetallic dielectric layer structure of the silicon-on-insulator device further includes a silicon nitride layer provided between the metal interconnection and the fluorine-silicon glass layer.

It is also necessary to provide a silicon-on-insulator device.

A silicon-on-insulator device includes a substrate, a buried oxide layer formed on the substrate, a well region formed on the buried oxide layer, a source structure and a drain structure formed in the well region, a gate structure and an interlayer dielectric layer formed on the well region, a first intermetallic dielectric layer formed on the interlayer dielectric layer and a pad layer formed on a surface of the silicon-on-insulator device, a structure of the first intermetallic dielectric layer is an intermetallic dielectric layer structure according to one embodiment.

In one of embodiments, the interlayer dielectric layer includes a silicon oxide layer.

It is also necessary to provide a method of manufacturing an intermetallic dielectric layer of a silicon-on-insulator device.

A manufacturing method of an intermetallic dielectric layer of a silicon-on-insulator device includes the following steps: forming a metal interconnection line; depositing a Si-rich oxide and a fluorine-silicon glass to cover the metal interconnection line; depositing the fluorine-silicon glass by plasma enhanced chemical vapor deposition; performing a chemical mechanical polishing to remove redundant fluorine-silicon glass, and forming a Si-rich oxide layer and a fluorine-silicon glass layer, wherein a thickness of the Si-rich oxide layer is 700 angstroms ±10%; and forming an undoped silicate glass layer on the fluorine-silicon glass layer by plasma enhanced chemical vapor deposition.

In one of embodiments, the Si-rich oxide layer is an in-situ Si-rich oxide layer, depositing the Si-rich oxide and the fluorine-silicon glass is performed in a same deposition chamber.

In one of embodiments, a thickness of the undoped silicate glass layer is 2000 angstroms ±10%.

In one of embodiments, the manufacturing method further includes depositing and forming a silicon oxide layer between forming the metal interconnection line and depositing the Si-rich oxide and the fluorine-silicon glass.

For the above SOI device, when the mobile ions generated during the back end process move towards the lower structures through the Si-rich oxide layer, the Si-rich oxide layer with greater thickness can capture and bind the mobile ions to the unsaturated bond, such that it is difficult for the mobile ions to pass through the Si-rich oxide layer, and the purpose of blocking the mobile ions is achieved. Therefore, the device exhibits a good performance in evaluation of gate oxide integrity (GOI), and the damage of the device by accumulation of the mobile ions at the interface is avoided.

DETAILED DESCRIPTION OF THE EMBODIMENTS

The objects, features and advantages of the present invention will become more apparent by describing in detail embodiments thereof with reference to the accompanying drawings.

Figure 1:
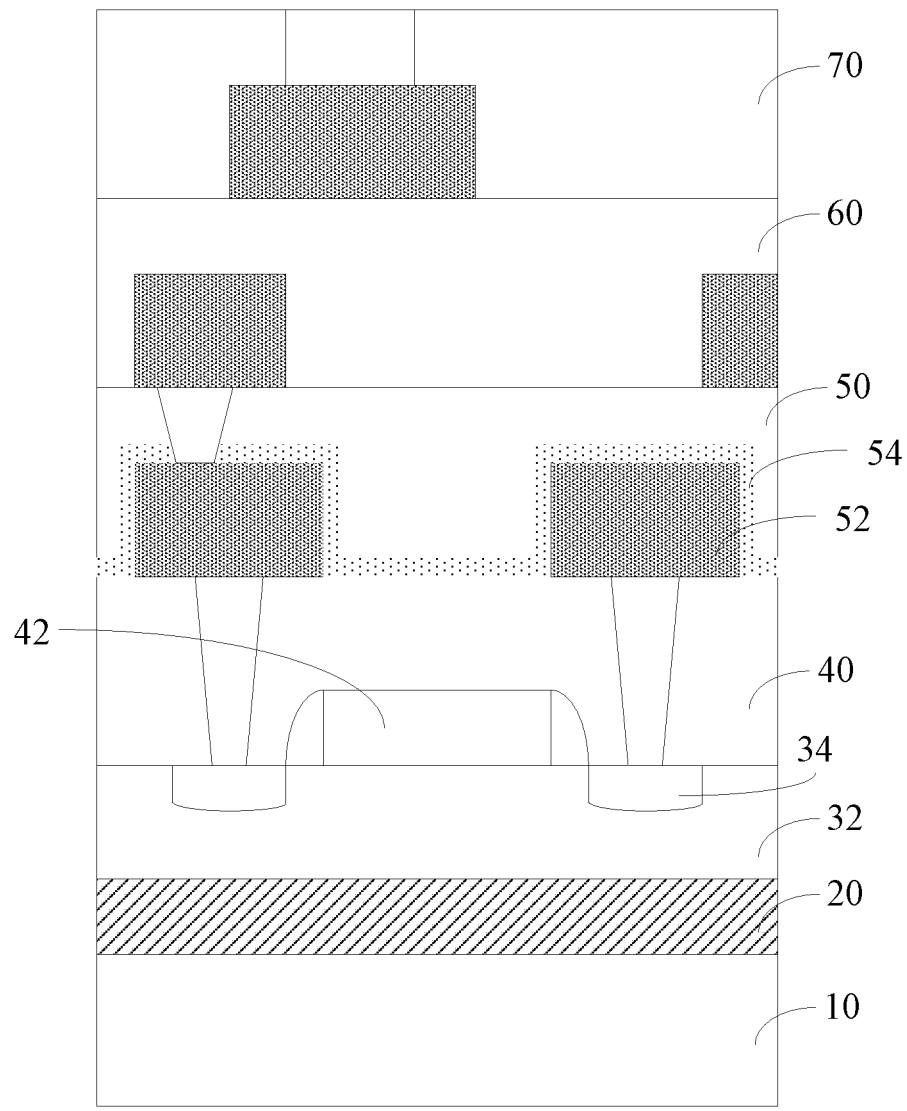
FIG. 1 is a sectional view of a silicon-on-insulator device in an embodiment.

FIG. 1 is a sectional view of the silicon-on-insulator (SOI) device in an embodiment. The device includes a substrate 10, a buried oxide layer 20 formed on the substrate 10, a well region 32 formed on the buried oxide layer 20, a source (drain) structure 34 formed in the well region 32, a gate oxide layer (not shown in FIG. 1), a gate 42 and an interlayer dielectric (ILD) layer 40 formed on the well region 32, a first intermetallic dielectric layer 50 formed on the interlayer dielectric layer 40 and a pad layer 70 formed on a surface of the device. In the embodiment, a silicon oxide layer is included in the interlayer dielectric layer 40. One or more second intermetallic dielectric layers 60 may be also provided between the first intermetallic dielectric layer 50 and the pad layer 70. The first intermetallic dielectric layer 50 uses a new IMD structure.

Specifically, the first intermetallic dielectric layer 50 includes a Si-rich oxide (SRO) layer 54 covering a metal interconnection 52 of the layer, a fluorine-silicon glass (FSG) layer formed on the Si-rich oxide layer 54, and an undoped silicate glass (USG) layer formed on the fluorine-silicon glass layer, in which the fluorine-silicon glass layer and the undoped silicate glass layer are drawn together in FIG. 1. The Si-rich oxide layer is configured to block mobile ions. In order to achieve the purpose, the Si-rich oxide layer should be of sufficient thickness. In the illustrated embodiment, the thickness of the Si-rich oxide layer is 700 angstroms ±10%, preferably 700 angstroms.

Figure 3:
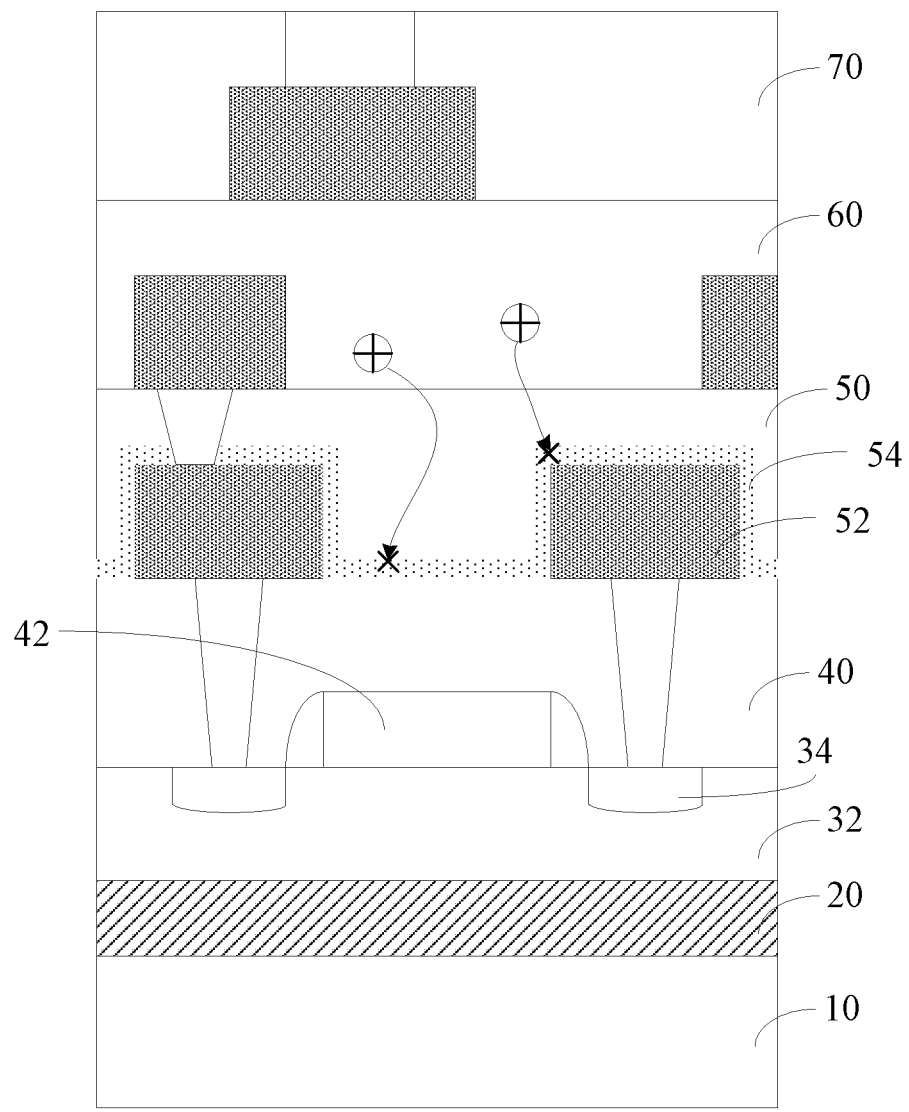
FIG. 3 is a schematic view showing mobile ions being blocking by a Si-rich oxide layer in an embodiment.

By experiment and study the inventor finds that the Si-rich oxide layer 54 itself is enriched with silicon unsaturated bonds. When the mobile ions generated during the back end process move towards the lower structures through the Si-rich oxide layer 54, the Si-rich oxide layer 54 with greater thickness can capture and bind the mobile ions to the unsaturated bond, such that it is difficult for the mobile ions to pass through the Si-rich oxide layer, and the purpose of blocking the mobile ions is achieved, as shown in FIG. 3. Therefore, the device exhibits a good performance in evaluation of gate oxide integrity (GOI), and the damage of the device by accumulation of the mobile ions at the interface is avoided.

In the embodiment, the Si-rich oxide layer 54 is an in-situ Si-rich oxide layer. In other words, steps of depositing the Si-rich oxide and the fluorine-silicon glass are performed in a same deposition chamber. Comparing with the solution of depositing the Si-rich oxide and the fluorine-silicon glass by using two machines respectively, the embodiments save time of loading and unloading cargo, product transmission and wait in line between two depositions, which improves productivity.

In the embodiment, a thickness of the undoped silicate glass layer is 2000 angstroms ±10%, preferably 2000 angstroms.

In one of embodiments, the first intermetallic dielectric layer 50 further includes a silicon oxide layer which is formed between the metal interconnection 52 and the fluorine-silicon glass layer. The layer of silicon oxide can further enhance effect of blocking the mobile ions.

Figure 2:
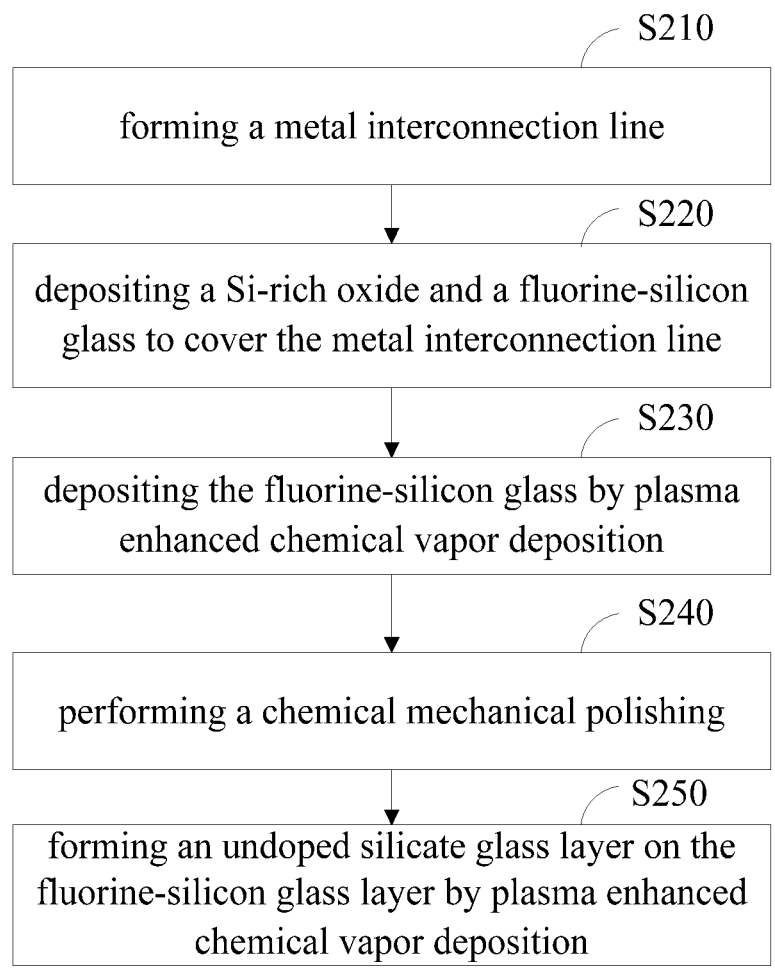
FIG. 2 shows a flow chart of a method of manufacturing an intermetallic dielectric layer of the silicon-on-insulator device in an embodiment.

A method of manufacturing the intermetallic dielectric layer of the silicon-on-insulator device is further provided, as shown in FIG. 2. The method includes the following steps:

S210, a metal interconnection line is formed.

The metal interconnection line can be formed above ILD by performing the deposition process firstly and then the etching process.

S220, a Si-rich oxide and a fluorine-silicon glass are deposited to cover the metal interconnection line.

In the embodiment, steps of depositing the Si-rich oxide and the fluorine-silicon glass are performed in a same deposition chamber, so as to form the in-situ Si-rich oxide layer. In the embodiment, in the step the fluorine-silicon glass of a thickness of 8000 angstroms is deposited.

S230, the fluorine-silicon glass is deposited by plasma enhanced chemical vapor deposition (PECVD).

After the step of S220 is completed, a layer of the fluorine-silicon glass is deposited by using the plasma enhanced chemical vapor deposition process. In the embodiment, in the step the fluorine-silicon glass of a thickness of 11500 angstroms is deposited.

S240, a chemical mechanical polishing (CMP) is performed.

The fluorine-silicon glass deposited in steps of S220 and S230 is polished by CMP to achieve the planarization effect. In the embodiment, the fluorine-silicon glass is polished to be a thickness of 6500 angstroms. The Si-rich oxide layer and the fluorine-silicon glass layer are obtained after the polishing process is completed.

S250, an undoped silicate glass layer is formed on the fluorine-silicon glass layer by plasma enhanced chemical vapor deposition.

In the embodiment, the deposited undoped silicate glass layer is of a thickness of 2000 angstroms.

The invention ensure that in the high voltage/low voltage region, in the case that the test structure GOI of the field edge behaves well, GOI of Poly edge (especially P Poly edge) is improved obviously.

In one of embodiments, a step of depositing a silicon nitride film is included between steps of S210 and S220. The layer of silicon nitride can further enhance effect of blocking the mobile ions.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A silicon-on-insulator device, comprising a substrate, a buried oxide layer formed on the substrate, a well region formed on the buried oxide layer, a source structure and a drain structure formed in the well region, a gate and an interlayer dielectric layer formed on the well region, a first intermetallic dielectric layer formed on the interlayer dielectric layer, and a pad layer formed on a surface of the device, wherein a structure of the first intermetallic dielectric layer is an intermetallic dielectric layer structure comprising: a Si-rich oxide layer covering a metal interconnection, a fluorine-silicon glass layer formed on the Si-rich oxide layer, and an undoped silicate glass layer formed on the fluorine-silicon glass layer; wherein a thickness of the Si-rich oxide layer is 700 angstroms ±10% so as to capture and bind mobile ions to unsaturated bonds, such that it is difficult for the mobile ions to pass through the Si-rich oxide layer, which provides a good performance in evaluation of gate oxide integrity (GOI); wherein a thickness of the undoped silicate glass layer is 2000 angstroms ±10%, and wherein a thickness of the fluorine-silicon glass is 6500 angstroms.

2. The silicon-on-insulator device of claim 1, characterized in that, the interlayer dielectric layer comprises a silicon oxide layer.

3. The silicon-on-insulator device of claim 1, characterized in that, the Si-rich oxide layer is an in-situ Si-rich oxide layer.

4. The silicon-on-insulator device of claim 1, further comprising a silicon nitride layer provided between the metal interconnection and the fluorine-silicon glass layer.

* * * * *